(12) United States Patent
Uchiyama et al.

(10) Patent No.: US 10,054,787 B2
(45) Date of Patent: Aug. 21, 2018

(54) ELECTRO-OPTICAL DEVICE, MANUFACTURING METHOD THEREOF, AND ELECTRONIC APPARATUS

(71) Applicant: SEIKO EPSON CORPORATION, Tokyo (JP)

(72) Inventors: Suguru Uchiyama, Suwa (JP); Terunao Hanaoka, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 29 days.

(21) Appl. No.: 15/621,389

(22) Filed: Jun. 13, 2017

(65) Prior Publication Data

US 2017/0276930 A1    Sep. 28, 2017

Related U.S. Application Data

(62) Division of application No. 15/017,101, filed on Feb. 5, 2016, now Pat. No. 9,709,800.

(30) Foreign Application Priority Data

Mar. 26, 2015  (JP) ................. 2015-063929

(51) Int. Cl.
  *G02B 26/08*  (2006.01)
  *B81C 1/00*  (2006.01)
(52) U.S. Cl.
  CPC ...... *G02B 26/0841* (2013.01); *B81C 1/00317* (2013.01); *G02B 26/0833* (2013.01); *B81B 2201/042* (2013.01); *B81C 2203/0118* (2013.01)
(58) Field of Classification Search
  CPC ................. G02B 26/0833; G02B 26/0841

USPC ............................... 359/514, 223.1
See application file for complete search history.

(56) References Cited

U.S. PATENT DOCUMENTS

| | | | |
|---|---|---|---|
| 2,255,748 A * | 9/1941 | Haggart, Jr. | ...... G02B 5/126 29/511 |
| 5,233,459 A | 8/1993 | Bozler et al. | |
| 5,784,189 A | 7/1998 | Bozler et al. | |
| 6,481,570 B1 * | 11/2002 | Henshall | ...... G02B 26/0841 206/213.1 |

(Continued)

FOREIGN PATENT DOCUMENTS

| JP | H08-512141 A | 12/1996 |
|---|---|---|
| JP | 2009-048009 A | 3/2009 |

(Continued)

OTHER PUBLICATIONS

Oct. 20, 2016 U.S. Office Action Issued in U.S. Appl. No. 15/017,101.

*Primary Examiner* — Ricky D Shafer
(74) *Attorney, Agent, or Firm* — Oliff PLC

(57) ABSTRACT

In an electro-optical device, a mirror and the like which is formed on an element substrate is sealed using a sealing member. The sealing member is provided with a frame section and a cover section. In addition, the sealing member is provided on one face of the element substrate so that the mirror is surrounded by the element substrate and the sealing member and such that the mirror is positioned between a portion of the cover section and the element substrate. The sealing member is formed of a light-transmitting member having a frame section and a cover section which are integrally formed, and there is no interface between the frame section and the cover section.

3 Claims, 11 Drawing Sheets

(56) References Cited

U.S. PATENT DOCUMENTS

| | | | |
|---|---|---|---|
| 6,856,014 B1 | 2/2005 | Ehmke et al. | |
| 8,526,098 B2 | 9/2013 | Hofmann et al. | |
| 9,465,210 B1 | 10/2016 | Hanaoka | |
| 9,541,729 B2* | 1/2017 | Kondo | G02B 7/1815 |
| 9,547,169 B2* | 1/2017 | Yamasaki | G02B 26/085 |
| 9,557,561 B2* | 1/2017 | Kondo | G02B 26/0833 |
| 9,709,800 B2* | 7/2017 | Uchiyama | G02B 26/0841 |
| 2003/0211654 A1* | 11/2003 | Kocian | B81C 99/004 438/116 |
| 2005/0057331 A1 | 3/2005 | Murata | |
| 2005/0263866 A1 | 12/2005 | Wan | |
| 2006/0176539 A1* | 8/2006 | Choi | B81B 7/0067 359/226.1 |
| 2007/0001247 A1 | 1/2007 | Patel et al. | |
| 2010/0296151 A1 | 11/2010 | Hofmann et al. | |
| 2015/0210538 A1* | 7/2015 | Su | G02B 27/0006 359/514 |
| 2016/0025901 A1* | 1/2016 | Eguchi | G02B 1/116 359/514 |
| 2016/0282582 A1 | 9/2016 | Kondo | |
| 2016/0282608 A1 | 9/2016 | Kondo | |
| 2016/0282609 A1 | 9/2016 | Hanaoka et al. | |
| 2016/0377965 A1* | 12/2016 | Hanaoka | G02B 26/0833 353/22 |
| 2017/0146794 A1* | 5/2017 | Kondo | G02B 26/0833 |

FOREIGN PATENT DOCUMENTS

| | | |
|---|---|---|
| JP | 2010-533883 A | 10/2010 |
| JP | 2012-027337 A | 2/2012 |

\* cited by examiner

FIG. 6A
FIG. 6C
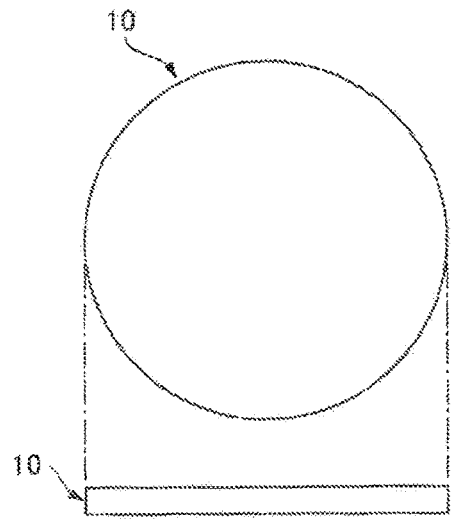
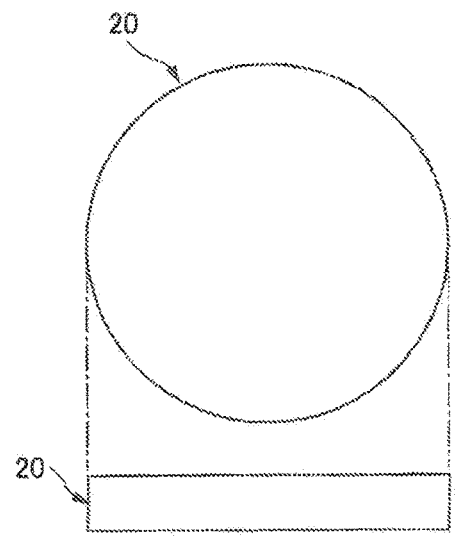
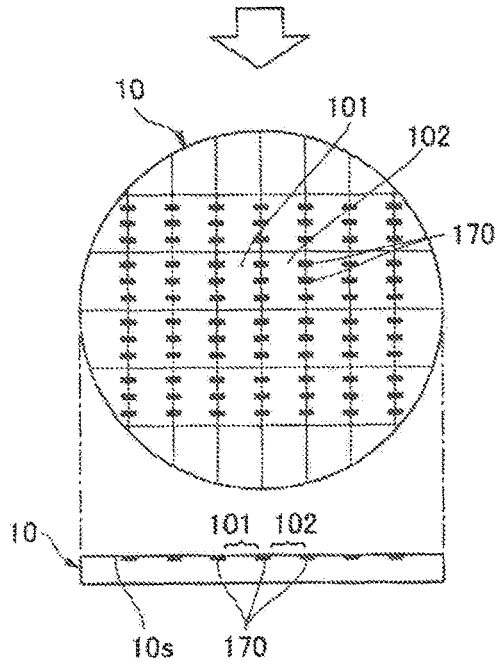
FIG. 6B
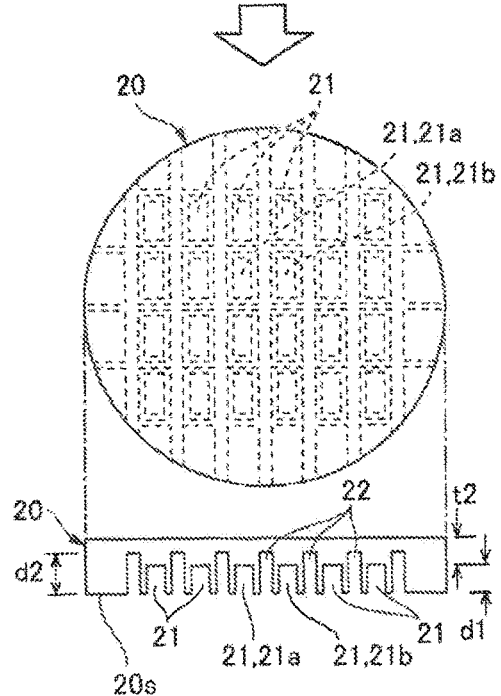
FIG. 6D ially with the frame section,
ELECTRO-OPTICAL DEVICE, MANUFACTURING METHOD THEREOF, AND ELECTRONIC APPARATUS This application is a divisional of U.S. application Ser. No. 15/017,101 filed Feb. 5, 2016, which is based on and claims priority under 35 U.S.C. 119 from Japanese Patent Application No. 2015-063929 filed on Mar. 26, 2015, the entire disclosures of which are expressly incorporated by reference herein.

BACKGROUND

1. Technical Field

The present invention relates to a manufacturing method of an electro-optical device which is provided with a mirror, the electro-optical device, and an electronic apparatus.

2. Related Art

As an electronic apparatus, for example, a projection-type display device and the like is known which displays an image on a screen by enlarging and projecting modulated light using a projection optical system after light which is emitted from a light source is modulated by a plurality of mirrors (micro mirrors) of an electro-optical device referred to as a digital mirror device (DMD). As shown in FIG. 12, the electro-optical device which is used in the projection-type display device and the like has an element substrate 1 which is provided with a plurality of mirrors 50 on one face is side, and the mirror 50 is sealed by a spacer 61 (sealing member) which is adhered to the one face is of the element substrate 1 so as to surround the mirror 50 and a plate-like light-transmitting cover 71 (sealing member) which is adhered to an end section on the opposite side to the element substrate 1 of the spacer 61.

As a method for manufacturing the electro-optical device, a method is proposed in which a second wafer, which is obtained by overlapping and adhering a spacer wafer with a through hole formed thereon and a light-transmitting wafer, is adhered to a first wafer on which the mirror 50 is provided on one face 10s side, and the first wafer and the second wafer are split (for example, refer to U.S. Pat. No. 6,856,014 B1). According to the method, the spacer 61 is formed by the spacer wafer after splitting, and the light-transmitting cover 71 is formed by the light-transmitting wafer after splitting.

However, according to the method described in U.S. Pat. No. 6,856,014 B1, there is a problem in that it is not possible to avoid infiltration of moisture via an interface of the spacer 61 and the light-transmitting cover 71 since the spacer 61 and the light-transmitting cover 71 are adhered to each other. The infiltration of moisture causes adsorption of the tilted mirror 50 to a member on the periphery thereof via water droplets when the mirror 50 is driven. The adsorption is not preferable since the adsorption inhibits moving of the mirror 50 and the like.

SUMMARY

An advantage of some aspects of the invention is to provide an electro-optical device which is able to prevent moisture infiltrating via a sealing member with respect to a space in which a mirror is disposed, a manufacturing method of the electro-optical device, and an electronic apparatus.

An electro-optical device according to an aspect of the invention includes an element substrate, a mirror which is provided on a first face side of the element substrate, a driving element which is provided on the first face side of the element substrate and which drives the mirror, and a light-transmitting sealing member which has a frame section and a cover section formed integrally with the frame section, and is provided on the first face side such that the mirror is surrounded by the sealing member and the element substrate, and the mirror is positioned between a first portion of the cover section and the element substrate.

In the aspect of the invention, the first face side of the element substrate on which the mirror and the driving element are provided is sealed by the light-transmitting sealing member, and the frame section which surrounds the mirror and the cover section which faces the mirror are integral in the sealing member. For this reason, it is possible to prevent infiltration of moisture from between the frame section which functions as a spacer and the cover section which functions as the light-transmitting cover. Accordingly, when the mirror is driven, it is difficult for a failure to occur in which it is not possible to move the mirror due to adsorption of the tilted mirror to a member on the periphery thereof via water droplets.

In the aspect of the invention, for example, the thickness of the cover section may be thicker than the thickness of the frame section. According to this configuration, it is possible to increase mechanical strength of the electro-optical device.

A manufacturing method of the electro-optical device according to another aspect of the invention includes preparing a first wafer which is provided with a first mirror and a first driving element that drives the first mirror in a first region on a first face side, and which is provided with a second mirror and a second driving element that drives the second mirror in a second region which is adjacent to the first region on the first face side, forming a light-transmitting second wafer which has a second face with a first concave section and a second concave section, adhering the first face of the first wafer and the second face of the second wafer such that the first mirror and the first driving element overlap with the first concave section in planar view and such that the second mirror and the second driving element overlap with the second concave section in planar view, and splitting the first wafer and the second wafer along a region which overlaps with a region that is interposed by the first region and the second region in planar view.

In the manufacturing method of the electro-optical device according to the aspect of the invention, it is preferable that a first groove is formed deeper than the first concave section and the second concave section in a region which is interposed by the first concave section and the second concave section on the second face of the second wafer, in the forming of the second wafer, and thinning of the second wafer is performed in which the second wafer is split by thinning of the second wafer over a region from a third face which is a face on an opposite side to the second face of the second wafer to the first groove, in the splitting. In this case, it is possible to split the second wafer into a plurality of pieces by one time of thinning of the second wafer unlike a method in which the second wafer is split by a dicing blade.

In the manufacturing method of the electro-optical device according to the aspect of the invention, the first groove may be formed simultaneously with the first concave section and the second concave section in a region which is interposed by the first concave section and the second concave section on the second face of the second wafer, in the forming of the second wafer, and dicing of the second wafer may be performed in which the second wafer is split by a second wafer dicing blade being thrust to reach the first groove from a third face which is a face on an opposite side to the second face of the second wafer, in the splitting.

In the manufacturing method of the electro-optical device according to the aspect of the invention, it is preferable that the thickness of the second wafer dicing blade is thicker than the width of the first groove, and a cutting edge of the second wafer dicing blade is thrust to an intermediate position in a depth direction of the second groove before the dicing of the second wafer, in the dicing of the second wafer. According to this configuration, even in a case in which a bottom section of the second groove is an arc-shaped concave section, it is difficult for a convex section, which may cause a crack, to be formed on a side face of the sealing member.

In the manufacturing method of the electro-optical device according to the aspect of the invention, it is preferable that a second groove is formed in a region which is interposed by a first region and a second region on the first face of the first wafer before the splitting, and thinning of the first wafer is performed in which the first wafer is split by thinning of the first wafer over a region from a fourth face which is a face on an opposite side to the first face of the first wafer to the second groove, in the splitting. According to this configuration, it is possible to reduce a possibility of a crack being generated on a rear face (fourth face) of the first wafer when the first wafer is split by the dicing blade.

The electro-optical device to which the invention is applied is able to be used in various electronic apparatuses, and in this case, a light source section which irradiates the mirror with light from a light source is provided in the electronic apparatus. In addition, in a case where a projection-type display device is configured as the electronic apparatus, a projection optical system which projects light which is modulated using the mirror is further provided in the electronic apparatus.

BRIEF DESCRIPTION OF THE DRAWINGS

The invention will be described with reference to the accompanying drawings, wherein like numbers reference like elements.

FIGS. 6A to 6D are diagrams illustrating a process in a manufacturing method of a second wafer or the like which is used in manufacture of the electro-optical device to which the invention is applied.

DESCRIPTION OF EXEMPLARY EMBODIMENTS

Figure 1:
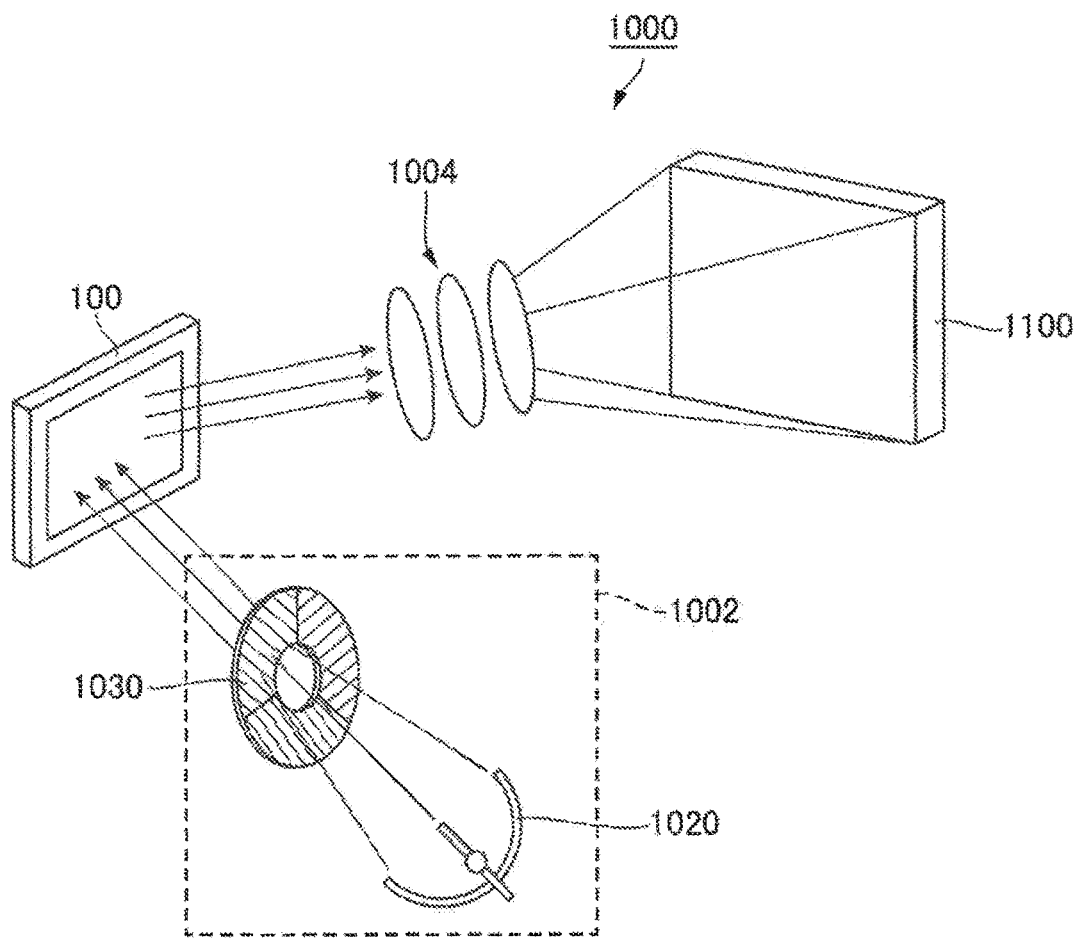
FIG. 1 is a schematic view illustrating an optical system of a projection-type display device as an electronic apparatus to which the invention is applied.

Embodiments of the invention will be described with reference to the drawings. Here, a projection-type display device will be described below as an electronic apparatus to which the invention is applied. In addition, in the drawings described below, the scale of each layer and each member is different in order for the sizes of each layer and each member to be to the extent so as to be recognizable in the drawings. In addition, the number of mirrors which are indicated in the drawings are set to be to the extent so as to be recognizable in the drawings, but a larger number of mirrors or the like than illustrated in the drawings may be provided. Here, in the embodiments below, for example, a case where "disposed on a first face side" is described, a case of disposing so as to come into contact with the first face, a case of disposing on the first face via another construction, or a case of disposing a portion so as to come into contact with the first face and disposing the portion via another construction may be included.

Projection-Type Display Device as Electronic Apparatus

FIG. 1 is a schematic view illustrating an optical system of a projection-type display apparatus as an electronic apparatus to which the invention is applied. A projection-type display device 1000 which is illustrated in FIG. 1 has a light source section 1002, an electro-optical device 100 which modulates light which is irradiated from the light source section 1002 according to image information, and a projection optical system 1004 which projects the light which is modulated by the electro-optical device 100 as a projection image onto a projection target 1100 such as a screen. The light source section 1002 is provided with a light source 1020 and a color filter 1030. The light source 1020 emits white light, the color filter 1030 emits light of each color accompanying rotation, the electro-optical device 100 modulates incident light at a timing synchronized with the rotation of the color filter 1030. Here, a fluorescent substrate which converts the light emitted from the light source 1020 to light of each color may be used in place of the color filter 1030. In addition, the light source section 1002 and the electro-optical device 100 may be provided in each light of each color.

Basic Configuration of Electro-Optical Device 100

Figure 2A:
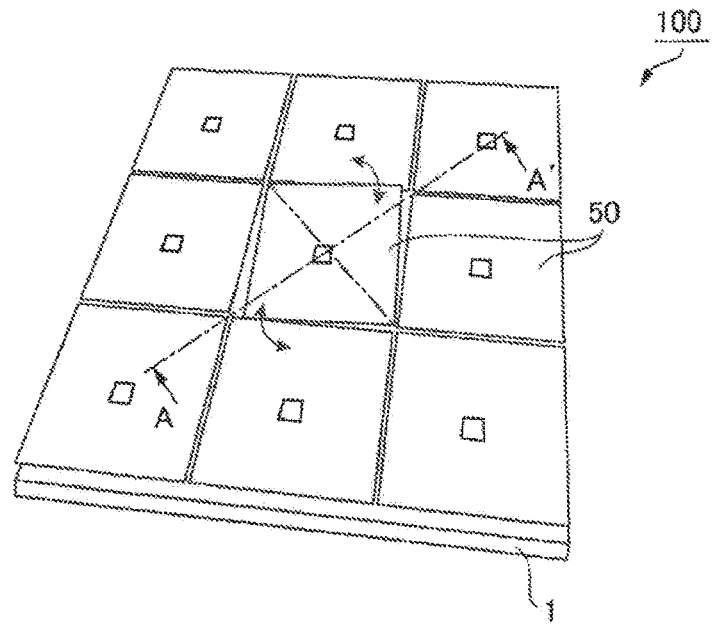
FIGS. 2A and 2B are explanatory views schematically illustrating a basic configuration of an electro-optical device to which the invention is applied.
Figure 2B:
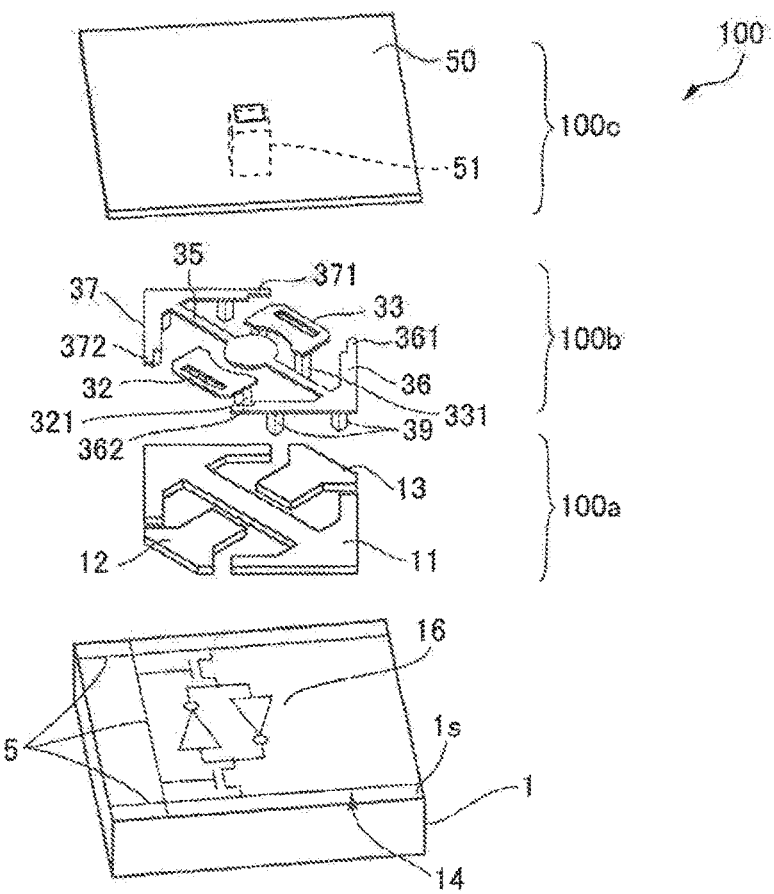
Figure 3A:
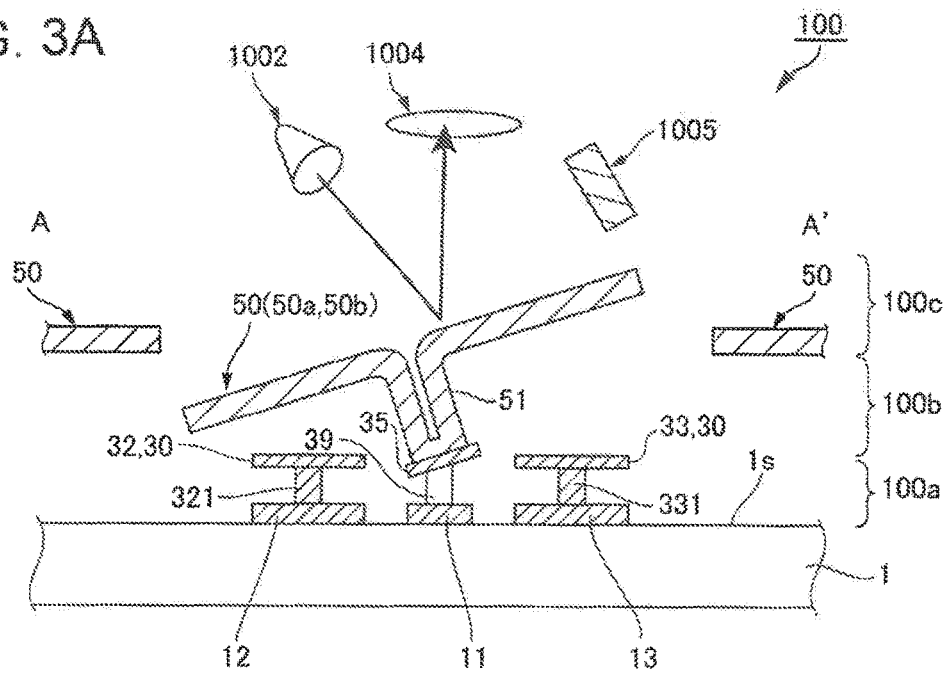
FIGS. 3A and 3B are explanatory views schematically illustrating a cross section along line A-A' in FIG. 2A of the main section of the electro-optical device to which the invention is applied.
Figure 3B:
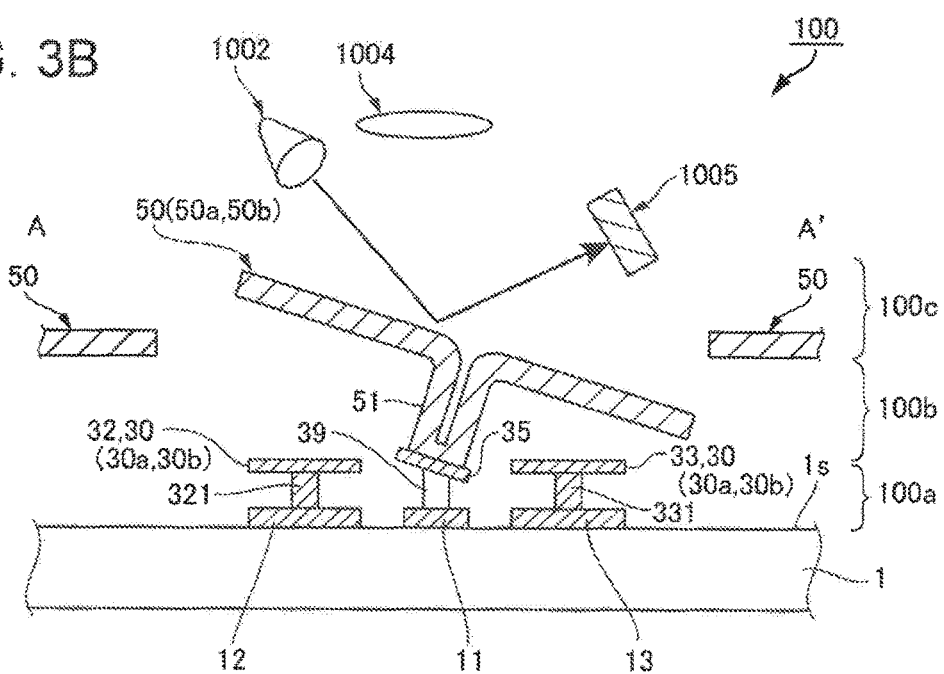

FIGS. 2A and 2B are explanatory views schematically illustrating a basic configuration of the electro-optical device 100 to which the invention is applied, FIG. 2A is an explanatory view illustrating a main section of the electro-optical device 100, and FIG. 2B is an exploded perspective diagram of the main section of the electro-optical device 100. FIGS. 3A and 3B are explanatory views schematically illustrating a cross section along line A-A' in FIG. 2A of the main section of the electro-optical device 100 to which the invention is applied, FIG. 3A is an explanatory view schematically illustrating a state in which a mirror is tilted to one side, and FIG. 3B is an explanatory view schematically illustrating a state in which the mirror is tilted to another side.

As shown in FIGS. 2A to 3B, in the electro-optical device 100, a plurality of mirrors 50 are disposed in a matrix form on one face 1s (first face) side of an element substrate 1, and the mirrors 50 are separated from the element substrate 1. For example, the element substrate 1 is a silicon substrate. For example, the mirror 50 is a micro-mirror in which one side length has a planar size of, for example, 10 µm to 30 µm. For example, the mirror 50 is disposed with an array from 800×600 to 1028×1024, and one mirror 50 corresponds to one pixel of an image.

A front face of the mirror 50 is an opposite face formed of a reflective metallic film of aluminum or the like. The electro-optical device 100 is provided with a first level portion 100a which includes a substrate side bias electrode 11, substrate side address electrodes 12 and 13, and the like which are formed on the one face 1s of the element substrate 1, a second level portion 100b which includes elevated address electrodes 32 and 33, and a hinge 35, and a third level portion 100c which includes the mirror 50. On the first level portion 100a, an address designating circuit 14 is formed on the element substrate 1. The address designating circuit 14 is provided with a wire 15 or the like of a memory cell, a word line, or a bit line for selectively controlling the operation of each mirror 50, and has a circuit configuration which is similar to a random access memory (RAM) which is provided with a CMOS circuit 16.

The second level portion 100b includes the elevated address electrodes 32 and 33, the hinge 35, and a mirror post 51. The elevated address electrodes 32 and 33 are supported by the substrate side address electrodes 12 and 13 while conducting to the substrate side address electrodes 12 and 13 via electrode posts 321 and 331. Hinge arms 36 and 37 extend from both sides of the hinge 35. The hinge arms 36 and 37 are supported by the substrate side bias electrode 11 while conducting to the substrate side bias electrode 11 via an arm post 39. The mirror 50 is supported by the hinge 35 while conducting to the hinge 35 via the mirror post 51. Accordingly, the mirror 50 conducts to the substrate side bias electrode 11 via the mirror post 51, the hinge 35, the hinge arms 36 and 37, and the arm post 39, and a bias voltage is applied from the substrate side bias electrode 11. Here, stoppers 361, 362, 371, and 372 which prevent contact between the mirror 50 and the elevated address electrodes 32 and 33 are formed to abut with the leading ends of the hinge arms 36 and 37 when the mirror 50 is tilted.

The elevated address electrodes 32 and 33 configure a driving element 30 which drives such that the mirror 50 is tilted by generating electrostatic force with the mirror 50. In addition, there are cases where the substrate side address electrodes 12 and 13 are also configured so as to drive such that the mirror 50 is tilted due to electrostatic force being generated with the mirror 50, in this case, the driving element 30 is configured by the elevated address electrodes 32 and 33 and the substrate side address electrodes 12 and 13. As shown in FIGS. 3A and 3B, in the hinge 35, a driving voltage is applied to the elevated address electrodes 32 and 33, the hinge 35 twists when the mirror 50 is tilted so as to be pulled toward the elevated address electrode 32 or the elevated address electrode 33, and a force returning the mirror 50 to a posture parallel to the element substrate 1 is exhibited when suction force is eliminated with respect to the mirror 50 by stopping application of the driving voltage with respect to the elevated address electrodes 32 and 33.

As shown in FIG. 3A, for example, in the electro-optical device 100, the mirror 50 tilts to the elevated address electrode 32 side at one side, and an ON state is reached in which light which is emitted from the light source section 1002 is reflected toward the projection optical system 1004 by the mirror 50. In contrast to this, as shown in FIG. 3B, the mirror 50 tilts to the elevated address electrode 33 side at the other side, and an OFF state is reached in which light which is emitted from the light source section 1002 is reflected toward a light absorbing device 1005 by the mirror 50, and in the OFF state, the light is not reflected toward the projection optical system 1004. The driving is performed for each of the plurality of mirrors 50, and as a result, the light which is emitted from the light source section 1002 is modulated to image light using the plurality of mirrors 50 and projected from the projection optical system 1004, and an image is displayed.

Here, a yoke with a flat plate form which faces the substrate side address electrodes 12 and 13 is integrally provided with the hinge 35, electrostatic force which is generated between the elevated address electrodes 32 and 33 and the mirror 50 is applied, and the mirror 50 is driven by also using electrostatic force which acts between the substrate side address electrodes 12 and 13 and the yoke.

Structure of Electro-Optical Device 100
Seal Structure of Electro-Optical Device 100

Figure 4:
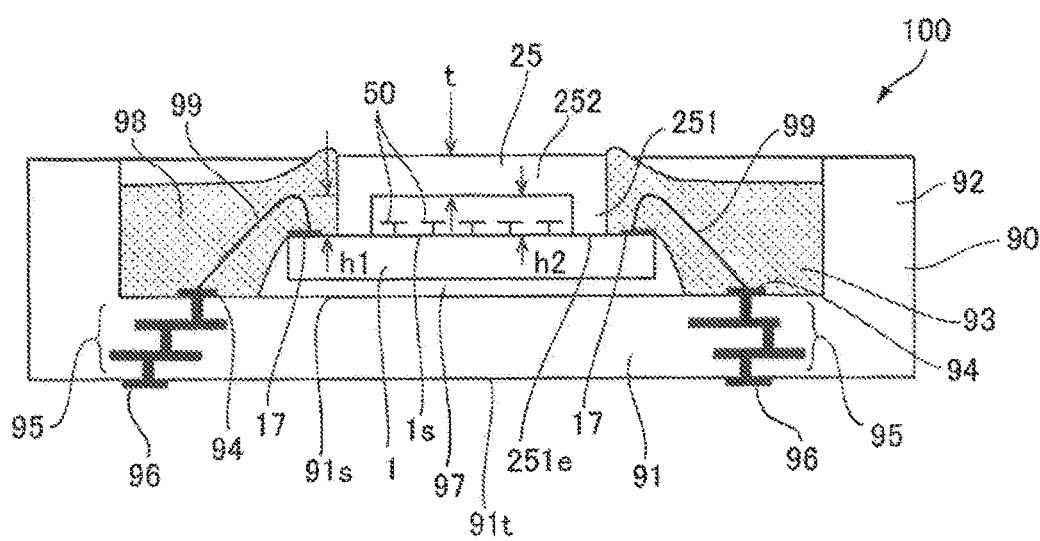
FIG. 4 is a sectional view of the electro-optical device to which the invention is applied.

FIG. 4 is a sectional view of the electro-optical device 100 to which the invention is applied. As shown in FIG. 4, in the electro-optical device 100 of the embodiment, the element substrate 1 on which the plurality of mirrors 50 are formed which are described with reference to FIGS. 2A to 3B is sealed by a sealing member 25 in which the one face is has translucency, then is fixed to a substrate mounting section 93 of a substrate 90, and then, is sealed using a sealing resin 98. In the substrate 90, the substrate mounting section 93 is a bottomed concave section which is enclosed by a side plate section 92, and the element substrate 1 is fixed using an adhesive 97 which is formed of a silver paste or the like on a bottom plate section 91 of the substrate 90.

On the one face 1s of the element substrate 1, a plurality of terminals 17 are formed on end sections which do not overlap with the mirror 50 in planar view (further outside a frame section 251). In the embodiment, the terminals 17 are disposed in two rows so as to interpose the mirror 50. A portion of the plurality of terminals 17 are electrically connected to the elevated address electrodes 32 and 33 (driving element 30) via the address designating circuit 14 and the substrate side address electrodes 12 and 13 which are described with reference to FIGS. 2A to 3B. Another portion of the plurality of terminals 17 are electrically connected to the mirror 50 via the address designating circuit 14, the substrate side bias electrode 11, and the hinge 35 which are described with reference to FIGS. 2A to 3B. Yet another portion of the plurality of terminals 17 are electrically connected to a driving circuit or the like which is provided at the front of the address designating circuit 14 which is described with reference to FIGS. 2A to 3B.

The terminal 17 is electrically connected by a wire 99 for wiring bonding to an internal electrode 94 which is formed on an inner face 91s on the element substrate 1 side of the bottom plate section 91 of the substrate 90. The bottom plate section 91 of the substrate 90 is a multi-layer substrate, and the internal electrode 94 conducts with an external electrode 96 which is formed on an outer face 91t on a side opposite to the element substrate 1 of the bottom plate section 91 via a multi-layer section 95 which is formed of a through hole and a wire that are formed on the bottom plate section 91.

The sealing resin 98 is provided inside (in a concave section) of the side plate section 92 of the substrate 90. The sealing resin 98 covers the wire 99, a joining section of the wire 99 and the terminal 17, a joining section of the wire 99 and the internal electrode 94, around the element substrate 1, a joining section of the element substrate 1 and the sealing member 25 (frame section 251), and the side face of the sealing member 25 to the middle in a thickness direction.

Configuration of Sealing Member 25

In the embodiment, the sealing member 25 is provided with the frame section 251 (spacer) which surrounds around the mirror 50 and the driving element (refer to FIGS. 2A to 3B), and a flat plate form cover section 252 which faces in an opposite direction to the element substrate 1 in the mirror 50, and the end section on the element substrate 1 side of the frame section 251 is adhered to the element substrate 1. In this state, the cover section 252 faces the front face of the mirror 50 at a position at intervals of a predetermined distance with respect to the mirror 50 on the opposite side to the element substrate 1. Here, the frame section 251 may surround the mirror 50 and the driving element in planar view (in detail, in planar view when viewed from the one face 1s of the element substrate 1). In addition, by providing the sealing member 25 in this manner, the mirror 50 is surrounded by the sealing member 25 and the element substrate 1, and the mirror 50 is positioned between a portion of the cover section 252 (first section) and the element substrate 1.

In the embodiment, the sealing member 25 is formed of a light-transmitting member which is integrally formed with the frame section 251 and the cover section 252. For example, the sealing member 25 is formed of a member made of glass which is integrally formed with the frame section 251 and the cover section 252. For this reason, the frame section 251 and the cover section 252 are connected in series, and there is no interface between the frame section 251 and the cover section 252.

In the electro-optical device 100 which is configured in such a manner, the light is incident onto the mirror 50 by penetrating the cover section 252, then the light which is incident at the mirror 50 is emitted so as to pass through the cover section 252. In the embodiment, the inside of the sealing member 25 adopts a configuration in which there is air, a configuration in which an inert gas and the like is filled in place of air, or a configuration in which there is a vacuum.

In the embodiment illustrated in FIG. 4, although the thickness t of the cover section 252 and a thickness h1 of the frame section 251 are equal, it is preferable that the thickness t of the cover section 252 be thinner than the thickness h1 of the frame section 251. In addition, it is preferable that the thickness t of the cover section 252 be larger than a distance h2 from a face which faces the element substrate 1 (or the mirror 50) of the cover section 252 to a face which is adhered to the element substrate 1 of the frame section 251. According to the configuration, in the electro-optical device 100 after sealing at the substrate 90, it is possible to increase mechanical strength of the entire electro-optical device 100 since it is possible to increase the mechanical strength of the cover section 252 which is exposed. The configuration is able to be realized by optimizing thickness in a second wafer 20 which will be described later, the depth of a concave section 21 and a groove 22, and the like.

Manufacturing Method of the Electro-Optical Device 100

The manufacturing method of the electro-optical device 100 to which the invention is applied will be described with reference to FIGS. 5A to 8C. FIGS. 5A to 5D are process sectional views illustrating the manufacturing method for the electro-optical device 100 to which the invention is applied. FIGS. 6A to 6D are process diagrams illustrating a manufacturing method of the second wafer 20 or the like which is used in manufacture of the electro-optical device 100 to which the invention is applied, and FIGS. 6A to 6D illustrate a cut end face view on a lower level of a planar view while illustrating a planar view of a wafer in each process. FIGS. 7A to 7D are process sectional views illustrating the method for forming a concave section and a groove in the second wafer 20 which is used in manufacture of the electro-optical device 100 to which the invention is applied. FIGS. 8A to 8C are process sectional views illustrating sealing of the element substrate 1 using the substrate 90 and the sealing resin 98 in the manufacturing of the electro-optical device 100 to which the invention is applied. In FIG. 6B, illustration of the mirror and the like is omitted, in FIGS. 5A to 5D and the like, illustration of the driving element 30 and the like is omitted, the number of mirrors 50 being reduced in comparison to FIG. 4 and two mirrors 50 being formed on one element substrate 1.

In the embodiment, a plurality of element substrates 1 and the like from a wafer are collected. For this reason, out of the regions in which it is possible to obtain a plurality of element substrates 1 of the first wafer 10, the mirror 50 and the driving element 30 which are formed in a first region 101 are respectively described below as a first mirror 50a and a first driving element 30a. In addition, in the first wafer 10, the mirror 50 and the driving element 30 which are formed in a second region 102 which is adjacent to the first region 101 in which the first mirror 50a and the first driving element 30a are formed will be respectively described as a second mirror 50b and a second driving element 30b. However, in a case where it is not necessary to specify whether there is any element substrate 1, description will be made without attaching a or b.

Figure 5A:
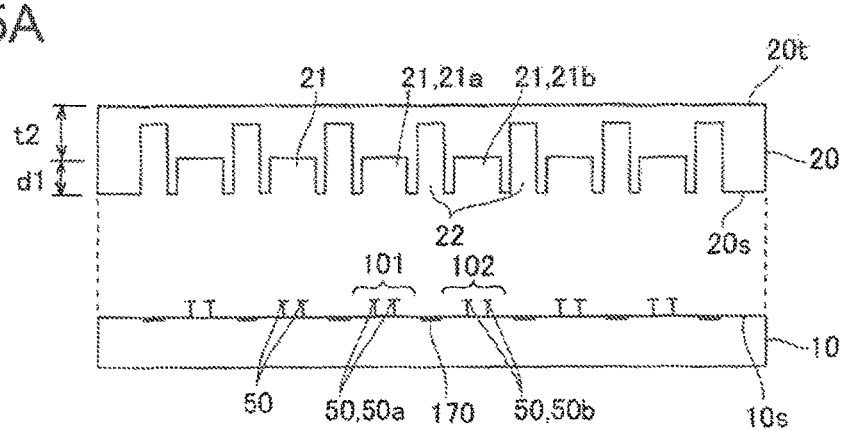
FIGS. 5A to 5D are sectional views illustrating a process in a manufacturing method of the electro-optical device to which the invention is applied.

As shown in FIGS. 5A and 6B, in the manufacture of the electro-optical device 100 according to the invention, in the first wafer preparation, the first wafer 10 on which the driving element 30 (refer to FIGS. 2A to 3B) is formed that drives the mirror 50 is prepared at a position which overlaps with the mirror 50 in planar view, while the mirror 50 is formed in each region in which the element substrate 1 is split with respect to the one face 10s (first face) of a large first wafer 10 which can take a large number of the element substrates 1. On the one face 10s of the first wafer 10, the first driving element 30a (refer to FIGS. 2A to 3B) is formed at a position which overlaps with the first mirror 50a in planar view while the first mirror 50a is formed in the first region 101. In addition, on the one face 10s of the first wafer 10, the second driving element 30b (refer to FIGS. 2A to 3B) is formed at a position which overlaps with the second mirror 50b in planar view while the second mirror 50b is formed in the second region 102. In addition, in the embodiment, a metal layer 170 is formed in order to form the terminal 17 so as to span the first region 101 and the second region 102. For example, as shown in FIGS. 5A, 6A, and 6B, the first wafer 10 may be prepared by forming the driving element 30 (refer to FIGS. 2A to 3B) that drives the mirror 50 at a position which overlaps with the mirror 50 in planar view, while the mirror 50 is formed in each region in which the element substrate 1 is split with respect to the one face 10s of the large first wafer 10 which can take a large number of the element substrates 1.

As in FIGS. 5A, 6C, and 6D, in second wafer formation, the large light-transmitting second wafer 20 which can take a large number of sealing members 25 is prepared. In the embodiment, the second wafer 20 is made of glass. On a second face 20s which forms one face of the second wafer 20, the concave section 21 is formed in each region in which the sealing member 25 is split, and the concave section 21 is open at the second face 20s. One out of a plurality of concave sections 21 there is a first concave section 21a, and the concave section 21 which is adjacent to the first concave section 21a is a second concave section 21b. Here, a depth d1 of the concave section 21 (concave section 21a and concave section 21b) may be smaller than a thickness t2 of the second wafer 20 at a location at which the concave section 21 is formed.

In addition, in the embodiment, the bottomed groove 22 which surrounds each of the plurality of concave sections 21 is formed to extend in two directions which intersect perpendicularly with each other on the second face 20s of the second wafer 20. Accordingly, one section of the groove 22 extends along between the first concave section 21a and the second concave section 21b. In the embodiment, the groove 22 is formed to be deeper than the concave section 21 (first concave section 21a and the second concave section 21b). That is, a depth d2 of the groove 22 is formed so as to be bigger than the depth d1 of the concave section 21 (refer to FIG. 6D).

Figure 7A:
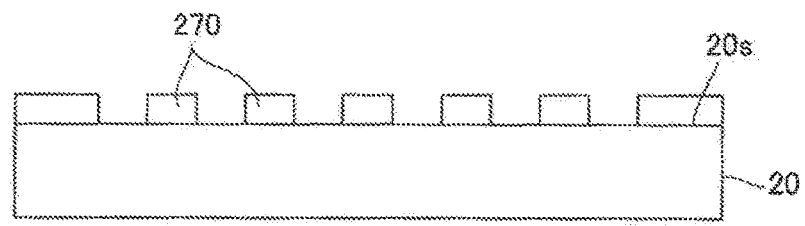
FIGS. 7A to 7D are sectional views illustrating a process in a method for forming a concave section and a groove in the second wafer which is used in manufacture of the electro-optical device to which the invention is applied.
Figure 7B:
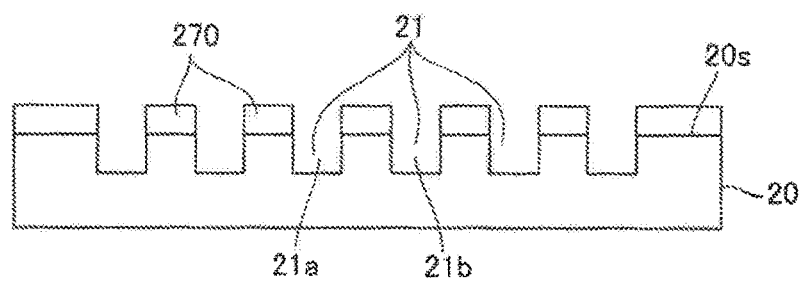
Figure 7C:
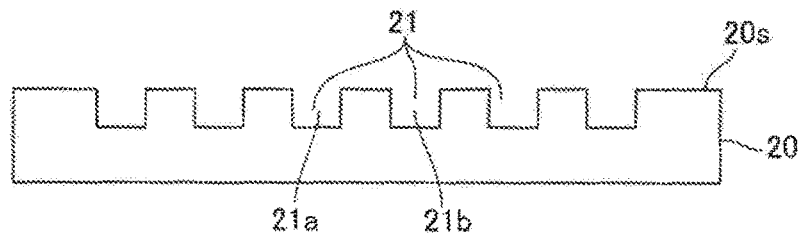
Figure 7D:
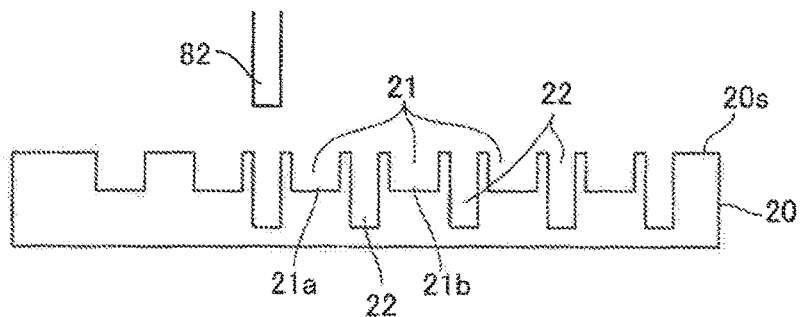
Figure 8A:
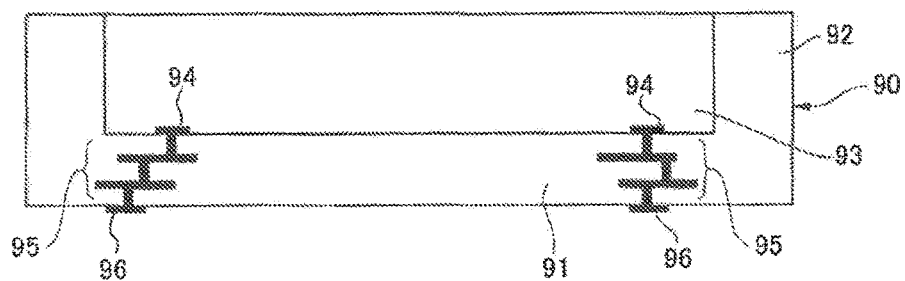
FIGS. 8A to 8C are sectional views illustrating a sealing process of an element substrate using a substrate and a sealing resin in the manufacture of the electro-optical device to which the invention is applied.
Figure 8B:
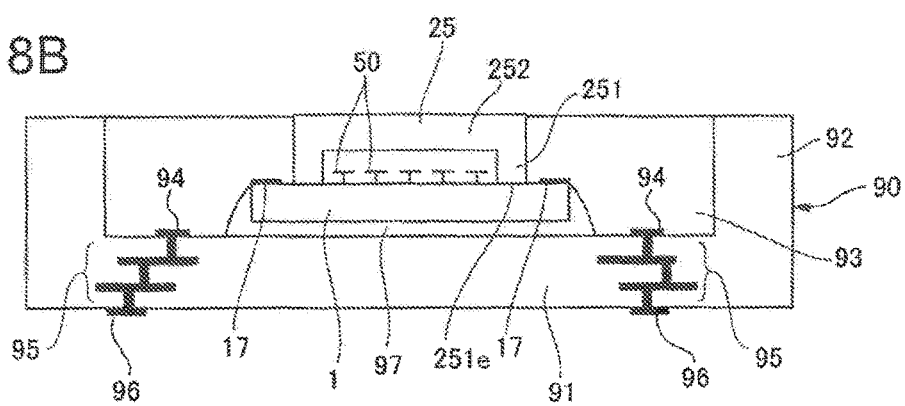
Figure 8C:
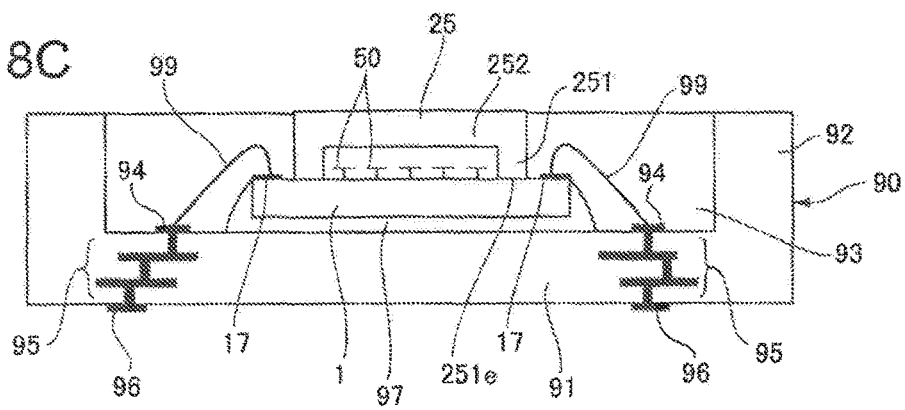

As shown in FIG. 7A, in the forming of the second wafer 20, for example, first, in a state in which a resist mask 270 is formed on the second face 20s of the second wafer 20, in etching which is illustrated in FIG. 7B, the concave section 21 (first concave section 21a and the second concave section 21b) is formed on the second face 20s of the second wafer 20 by dry etching, or wet etching using a potassium hydroxide solution. Next, as shown in FIG. 7C, after the resist mask 270 is removed, as shown in FIG. 7C, the groove 22 is formed using a dicing blade 83. Here, after the groove 22 is formed, the concave section 21 (first concave section 21a and the second concave section 21b) may be formed. In addition, the groove 22 and the concave section 21 (first concave section 21a and the second concave section 21b) may be formed by resist mask formation two times and etching two times. In addition, the groove 22 and the concave section 21 (first concave section 21a and the second concave section 21b) may be formed by stealth dicing using a laser.

Figure 5B:
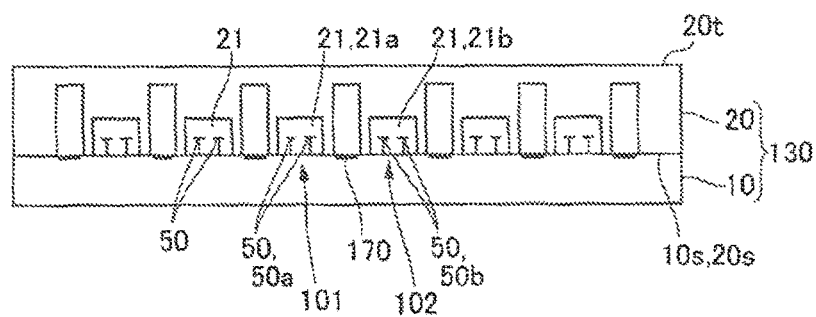

Next, in adhesion as shown in FIG. 5B, the concave section 21 overlaps with the mirror 50 in planar view (for example, in planar view when the first wafer 10 is viewed from the one face 10s), and the groove 22 is adhered to the one face 10s of the first wafer 10 and the second face 20s of the second wafer 20 so as to overlap between the first region 101 and the second region 102 in planar view. As a result, the first concave section 21a overlaps with the first mirror 50a and the first driving element 30a in planar view, the second concave section 21b overlaps with the second mirror 50b and the second driving element 30b in planar view, and the groove 22 overlaps with the metal layer 170 which is formed between the first concave section 21a and the second concave section 21b in planar view. Accordingly, the metal layer 170 is not adhered to the second wafer 20.

Figure 5C:
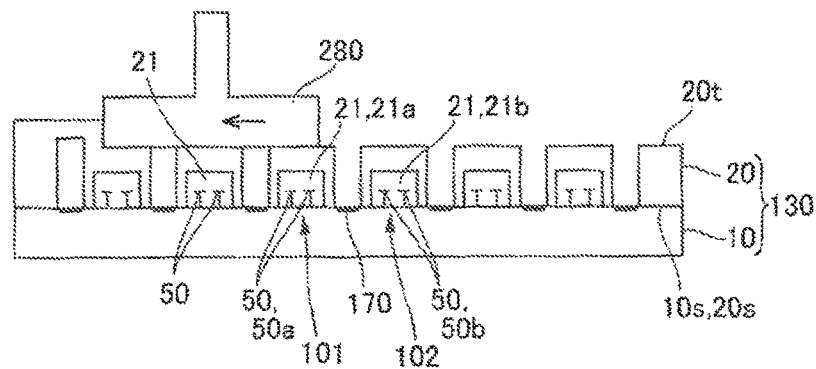
Figure 5D:
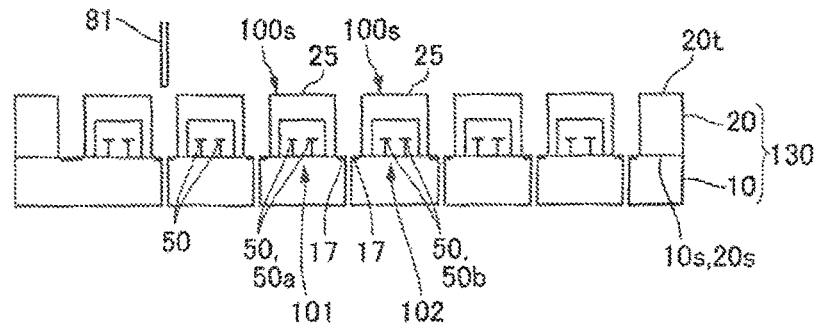

Next, in the splitting shown in FIGS. 5C and 5D, a laminated body 100s is obtained with a single item size which is fixed by the sealing member 25 overlapping with the element substrate 1 which is provided with the mirror 50 by a laminated body 130 being split into the first wafer 10 and the second wafer 20.

In the splitting, first, in thinning of the second wafer which is illustrated in FIG. 5C, the second wafer 20 is split by thinning of the second wafer 20 over a region from a third face 20t which is a face on an opposite side to the second face 20s of the second wafer 20 to the groove 22. In further detail, the second wafer 20 is thinned and the second wafer 20 is split due to grinding of the third face 20t of the second wafer 20 by a grinder 280. According to the configuration, it is possible to split the second wafer 20 into a plurality of pieces in the thinning of the second wafer of one time in comparison to a method in which the second wafer 20 is split using a dicing blade.

Next, in the first wafer dicing which is illustrated in FIG. 5D, the first wafer 10 is diced along a region (a region which interposes the first region 101 and the second region 102) in which the element substrate 1 is split in the first wafer 10 using a first wafer dicing blade 81. As a result, the first wafer 10 is split. At that time, the first wafer 10 becomes a terminal 17 by an electrode layer 170 being cut. In the embodiment, the thickness of the first wafer dicing blade 81 is thinner than the width of the groove 22. Accordingly, in the first wafer dicing, the first wafer 10 is diced by the first wafer dicing blade 81 being caused to enter inside the groove 22 from a side of the second wafer 20 with respect to the first wafer 10.

As a result, a plurality of the electro-optical devices 100 are manufactured on which the one face 1s of the element substrate 1 on which a plurality of the mirrors 50 are formed is sealed by the sealing member 25. As shown in FIG. 4, in a case where the electro-optical device 100 is further sealed using the substrate 90 and the sealing resin 98, a process illustrated in FIGS. 8A to 8C is performed.

First, as shown in FIG. 8A, the substrate 90 which becomes a concave section which is surrounded by the substrate mounting section 93 in the side plate section 92 is prepared, then, as shown in FIG. 8B, the element substrate 1 is fixed to the bottom section of the substrate mounting section 93 using the adhesive 97. Next, as shown in FIG. 8C, the terminal 17 of the element substrate 1 and the internal electrode 94 of the substrate 90 are electrically connected by the wire 99 for wiring bonding. Next, as shown in FIG. 4, the sealing resin 98 is injected inside the side plate section 92 of the substrate 90, then the sealing resin 98 is cured, and the element substrate 1 is sealed using the sealing resin 98. As a result, it is possible to obtain the electro-optical device 100 on which the element substrate 1 is sealed using the sealing member 25 (frame section 251 and cover section 252), the substrate 90 and the sealing resin 98.

Here, in the embodiment, a circular shape wafer is used, but a planar shape, a rectangular shape, and the like may be used.

Main Effects of Embodiment

As described above, in the electro-optical device 100 of the embodiment, the one face is side of the element substrate 1 on which the mirror 50 and the driving element 30 are provided is sealed by the light-transmitting sealing member 25, and in the sealing member 25, the frame section 251 which surrounds around the mirror 50 and the driving element 30 and the flat plate form cover section 252 which faces the mirror 50 are integral. For this reason, it is possible to prevent infiltration of moisture from between the frame section 251 which functions as the spacer and the cover section 252 which functions as the light-transmitting cover. Accordingly, when the mirror 50 is driven, it is difficult for a defect to be generated in which it is not possible to move the mirror 50 due to adsorption of water droplets to a member on the periphery of the tilted mirror 50.

Other Manufacturing Method of Electro-Optical Device 100

FIGS. 9A to 9D are process sectional views illustrating another manufacturing method for the electro-optical device 100 to which the invention is applied. FIGS. 10A and 10B are explanatory views illustrating dicing of the second wafer in the other manufacturing method for the electro-optical device 100 to which the invention is applied.

Figure 9A:
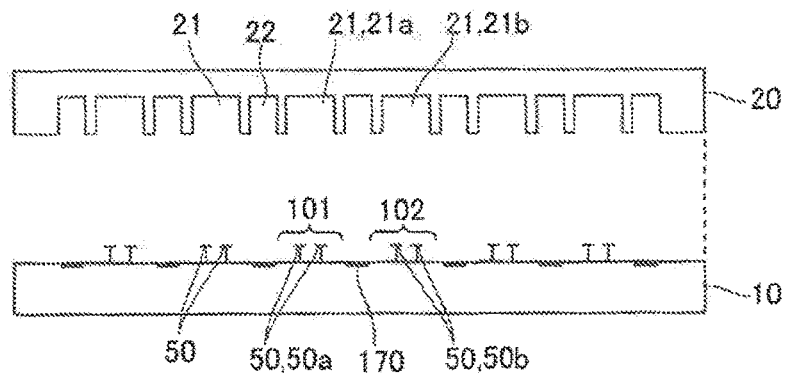
FIGS. 9A to 9D are sectional views illustrating a process in another manufacturing method of the electro-optical device to which the invention is applied.
Figure 10A:
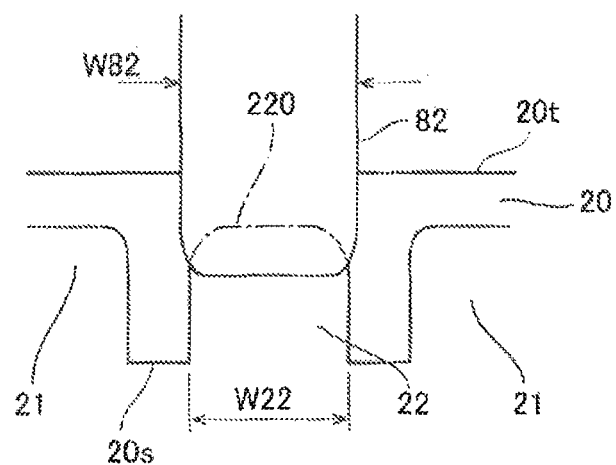
FIGS. 10A and 10B are explanatory views illustrating a second wafer dicing process in the other manufacturing method of the electro-optical device to which the invention is applied.
Figure 10B:
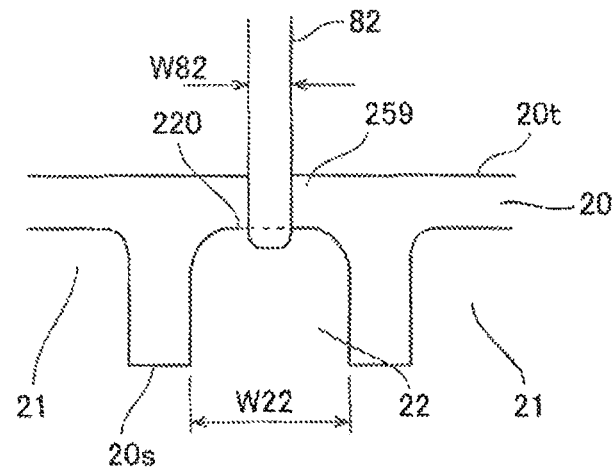

In the embodiments above, the groove 22 is formed deeper than the concave section 21 (first concave section 21a and second concave section 21b), but as shown in FIG. 9A, the groove 22 may be formed with the same depth as the concave section 21 (first concave section 21a and second concave section 21b). As shown in FIGS. 7A to 7C, the concave section 21 (first concave section 21a and second concave section 21b) and the groove 22 are able to be formed at the same time by etching in a state in which the resist mask 270 is formed.

Figure 9B:
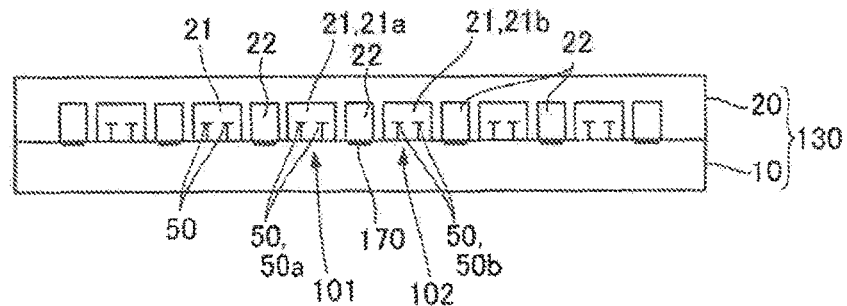

In this case, in adhesion as shown in FIG. 9B, the concave section 21 overlaps with the mirror 50 in planar view, and the groove 22 is adhered to the one face 10s of the first wafer 10 and the second face 20s of the second wafer 20 so as to overlap between the first region 101 and the second region 102 in planar view. As a result, the first concave section 21a overlaps with the first mirror 50a in planar view, the second concave section 21b overlaps with the second mirror 50b in planar view, and the groove 22 overlaps with the metal layer 170 which is formed between the first concave section 21a and the second concave section 21b in planar view. Accordingly, the metal layer 170 is not adhered to the second wafer 20.

Figure 9C:
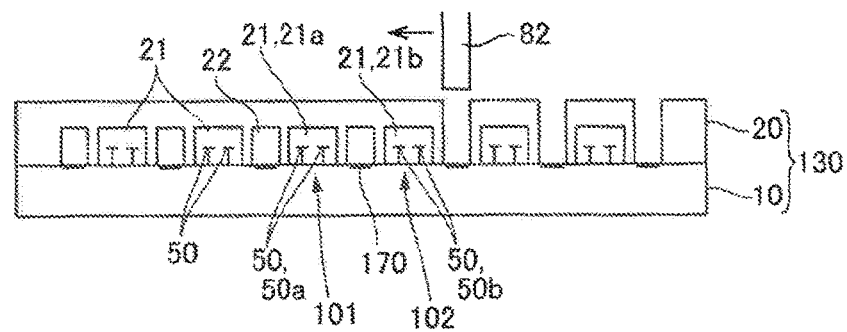
Figure 9D:
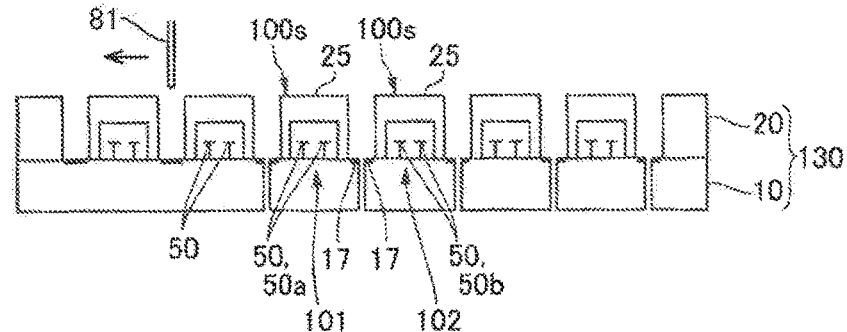

Next, in the splitting process shown in FIGS. 9C and 9D, a laminated body 100s is obtained with a single item size which is fixed by the sealing member 25 overlapping with the element substrate 1 which is provided with the mirror 50 by a laminated body 130 being split into the first wafer 10 and the second wafer 20.

In the splitting, first, in the dicing of the second wafer which is illustrated in FIG. 9C, the second wafer 20 is split by the second wafer dicing blade 82 being caused to enter from the third face 20t side of the second wafer 20 reaching the groove 22.

Next, in the splitting, in the first wafer dicing which is illustrated in FIG. 9D, the first wafer 10 is diced by the first wafer dicing blade 81 being caused to enter inside the groove 22 from a side of the second wafer 20 with respect to the first wafer 10. As a result, a plurality of the electro-optical devices 100 are manufactured on which the one face is of the element substrate 1 on which a plurality of the mirrors 50 are formed is sealed by the sealing member 25.

In such a manufacturing method, it is preferable that a thickness W82 of the second wafer dicing blade 82 which is illustrated in FIG. 9C be thicker than a width W22 of the groove 22, and that a cutting edge of the second wafer dicing blade 82 be caused to enter up to an intermediate position in a depth direction of the second groove 22 before dicing of the second wafer is performed. According to the configuration, as shown in FIG. 10A, even in a case in which a bottom section 220 of the second groove 22 becomes an arc-shaped concave section, it is difficult for a convex section to be generated such that a crack or the like is caused on a side face of the sealing member 25. That is, in a case where the bottom section 220 of the second groove 22 becomes an arc-shaped concave section, as shown in FIG. 10B, when a thickness W82 of the second wafer dicing blade 82 is thinner than the width W22 of the groove 22, a convex section 259 is generated on the side face of the sealing member 25. It is easy for the convex section 259 to crack. In addition, when a crack is generated on the convex section 259, the crack reaches the frame section 251 and the cover section 252, and in that case, the function of the sealing member 25 is reduced. However, according to the aspect which is illustrated in FIG. 10A, since the convex section 259, which is a cause of the crack or the like, is not easily generated, it is not easy for function reduction or the like of the sealing member 25 to be generated.

Yet Another Manufacturing Method of Electro-Optical Device 100

Figure 11A:
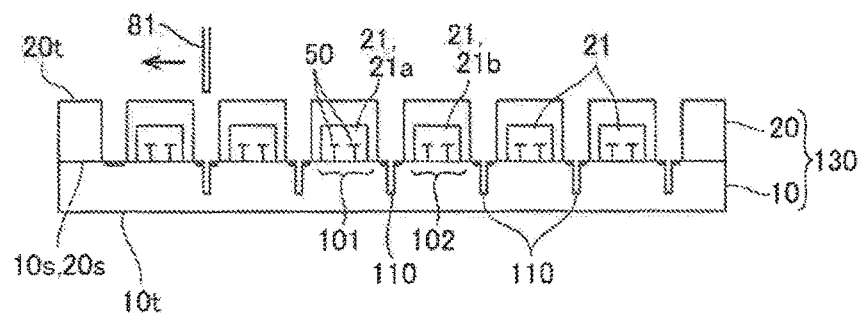
FIGS. 11A and 11B are explanatory views illustrating a first wafer splitting process in yet another manufacturing method of the electro-optical device to which the invention is applied.
Figure 11B:
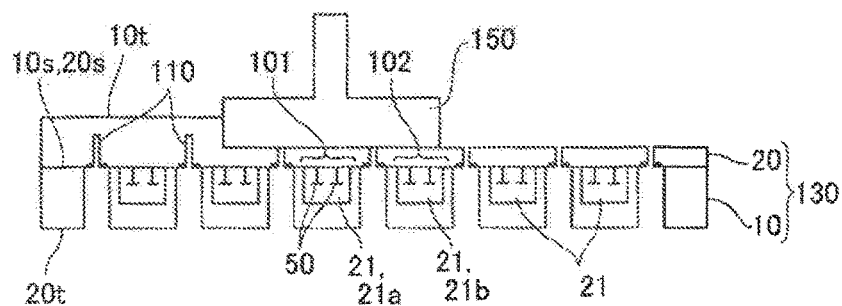
Figure 12:
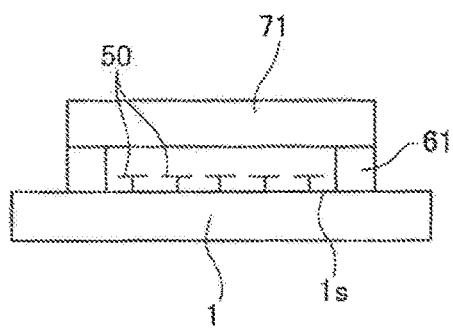
FIG. 12 is a sectional view of an electro-optical device according to a reference example of the invention.

FIGS. 11A and 11B are explanatory views illustrating a first wafer splitting process in yet another manufacturing method for the electro-optical device 100 to which the invention is applied.

In the aspect which is described with reference to FIGS. 5A to 5D and 9A to 9D, in the splitting which is illustrated in FIGS. 5D and 9D, the first wafer 10 is split by the first wafer dicing blade 81, but the first wafer 10 may be split using a dicing before grinding (DBG) method. In further detail, first, as shown in FIG. 11A, a groove 110 which extends along a region which is interposed in each region (first region 101 and second region 102) is formed on the one face 10s of the first wafer 10 before the splitting of the first wafer 10 is performed. In FIG. 11A, after the second wafer 20 is split, the aspect in which the groove 110 is formed is illustrated, but the groove 110 may be formed in a process therebefore.

Then, in the splitting, as shown in FIG. 11B, the first wafer thinning is performed in which the first wafer 10 is split by thinning the first wafer 10 over a region from another face 10t (fourth face) which is a face on an opposite side to the one face 10s of the first wafer 10 to the groove 110. In further detail, the first wafer 10 is thinned and the first wafer 10 is split due to grinding of the other face lot of the first wafer 10 by a grinder 150. According to the configuration, it is possible to reduce a concern of a crack being generated on the other face 10t of the first wafer when the first wafer 10 is split by the dicing blade.

What is claimed is:

1. An electro-optical device comprising:
   an element substrate;
   a mirror which is provided on a first face side of the element substrate;
   a driving element which is provided on the first face side of the element substrate and which drives the mirror; and
   a light-transmitting sealing member which has a frame section and a cover section formed integrally with the frame section, and is provided on the first face side such that the mirror is surrounded by the sealing member and the element substrate, and the mirror is positioned between a first portion of the cover section and the element substrate,
   wherein a thickness of the cover section is greater than a thickness of the frame section, and the thickness of the cover section is greater than a distance from a face of the cover section that faces the element substrate to a face of the frame section that is adhered to the element substrate.

2. An electronic apparatus provided with the electro-optical device according to claim 1, comprising:
   an emitting section which irradiates the mirror with light from a light source.

3. An electronic apparatus provided with the electro-optical device according to claim 1, wherein the cover section is parallel to the element substrate.

* * * * *